United States Patent
Wang

(10) Patent No.: US 10,843,484 B2
(45) Date of Patent: Nov. 24, 2020

(54) SHIFT CIRCUIT OPERATING BY USING A CAPACITOR, A PRINTING HEAD AND PRINTING DEVICE THEREOF

(71) Applicant: Avision Inc., Hsinchu (TW)

(72) Inventor: Jian-Zhi Wang, Hsinchu (TW)

(73) Assignee: AVISION INC., Hsinchu (TW)

( * ) Notice: Subject to any disclaimer, the term of this patent is extended or adjusted under 35 U.S.C. 154(b) by 0 days.

(21) Appl. No.: 16/677,917

(22) Filed: Nov. 8, 2019

(65) Prior Publication Data

US 2020/0171841 A1 Jun. 4, 2020

(30) Foreign Application Priority Data

Nov. 30, 2018 (TW) .............................. 107143155 A

(51) Int. Cl.
*B41J 2/447* (2006.01)
*H03K 5/133* (2014.01)
*B41J 2/045* (2006.01)

(52) U.S. Cl.
CPC ........... *B41J 2/447* (2013.01); *B41J 2/04521* (2013.01); *H03K 5/133* (2013.01)

(58) Field of Classification Search
CPC ..................................................... B41J 2/447
See application file for complete search history.

(56) References Cited

U.S. PATENT DOCUMENTS

| 3,659,853 A * | 5/1972 | Church | A63F 9/0468 463/22 |
| 2010/0225730 A1 * | 9/2010 | Taniwaki | B41J 2/451 347/224 |

FOREIGN PATENT DOCUMENTS

JP 04127584 A * 4/1992

* cited by examiner

*Primary Examiner* — Shelby L Fidler
(74) *Attorney, Agent, or Firm* — McClure, Qualey & Rodack, LLP

(57) ABSTRACT

A shift circuit operating by using a capacitor, a printing head and printing device thereof. The shift circuit includes a power signal line, a grounding signal line, a first shift signal line, a second shift signal line, a plurality of diodes, a plurality of grounding resistors, a plurality of thyristors, a cascaded resistor and a capacitor. The capacitor connects between the gate of the first thyristor and the first shift signal line. Therefore, the capacitor is charged during the off time of the period of the first clock signal, and starts to be discharged from an edge between the on time and the off time of the period of the first clock signal. During the on time of the period, the capacitor is fully discharged. Such that, the gate voltage of the first thyristor is sufficient to turn on the first thyristor and will not affect the following shift action.

18 Claims, 13 Drawing Sheets

SHIFT CIRCUIT OPERATING BY USING A CAPACITOR, A PRINTING HEAD AND PRINTING DEVICE THEREOF

CROSS-REFERENCE TO RELATED APPLICATION

This non-provisional application claims priority under 35 U.S.C. § 119(a) to Patent Application No. 107143155 in Taiwan, R.O.C. on Nov. 30, 2018, the entire contents of which are hereby incorporated by reference.

BACKGROUND

Technical Field

The present invention relates to a printing head, and in particular, to a printing head and method for improving printing resolution.

Related Art

At present, dozens of light-emitting chips are provided in a printing head. Each light-emitting chip requires a plurality of signal lines to perform light-emitting control on the respective light-emitting chips. Therefore, if the number of signal lines can be reduced as much as possible, the complexity of connecting the signal lines can be reduced.

SUMMARY

The present invention provides a shift circuit operating by using a capacitor, a printing head and printing device thereof. The shift circuit includes a power signal line, a grounding signal line, a first shift signal line, a second shift signal line, a plurality of diodes, a plurality of grounding resistors, a plurality of thyristors, a cascaded resistor and a capacitor. The power signal line is configured to receive an operating voltage. The grounding signal line is configured to obtain a grounding level. The first shift signal line is configured to receive a first clock signal, a period of the first clock signal including an on time and an off time. The second shift signal line is configured to receive a second clock signal. The plurality of diodes is cascaded end to end. The respective thyristors include a cathode, an anode and a gate. The respective anodes connect to the power signal line. The respective gates connect to the grounding signal line via the grounding resistors in a one-to-one correspondence manner, and the respective gates connect to one end of the respective diodes, such that the respective diodes connect between the gates of two adjacent thyristors, where the cathodes of the odd-ranked thyristors connect to the first shift signal line, and the cathodes of the even-ranked thyristors connect to the second shift signal line. The cascaded resistor connects between the gate of the first thyristor and the first power signal line. The capacitor connects between the gate of the first thyristor and the first shift signal line. Therefore, the capacitor is charged during the off time of the period of the first clock signal, and starts to be discharged from an edge between the on time and the off time of the period of the first clock signal. During the on time of the period, the capacitor is fully discharged.

In summary, by applying embodiments of the present invention, the complexity of a connection line outside a light-emitting chip can be reduced, and the cost can be reduced.

DETAILED DESCRIPTION

Figure 1:
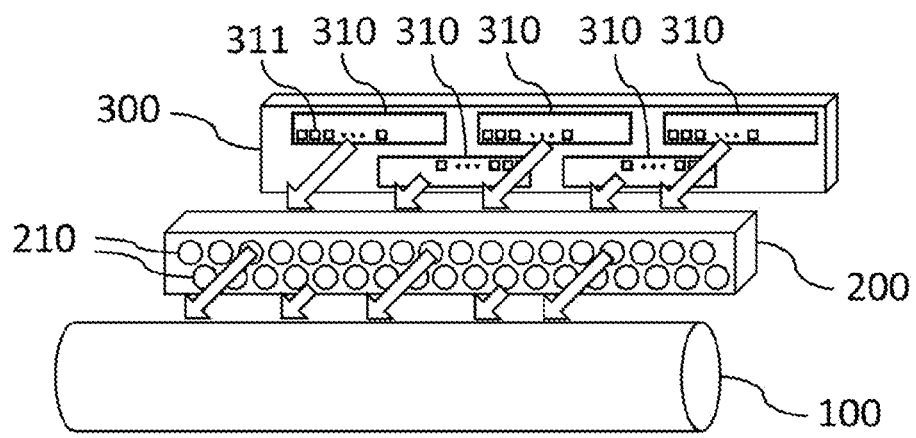
FIG. 1 is a photosensitive schematic diagram of a printing head according to an embodiment of the present invention.

In the following, a plurality of embodiments of the present invention will be disclosed in combination with the drawings. For the sake of clarity, a number of practical details will be described in the following description. However, it is to be understood that these practical details should not be intended to limit the present invention. That is to say, in some embodiments of the present invention, these practical details are not necessary. In addition, some of the conventional structures and elements are shown in the drawings in a simplified schematic manner in order to simplify the drawings.

Referring to FIG. 1, it is a photosensitive schematic diagram of a printing head according to an embodiment of the present invention. The printing head includes a light-emitting module 300 and a lens array 200 for outputting light toward a photosensitive drum 100. When the photosensitive drum 100 receives light, a photoelectric effect is generated to adsorb toner, whereby a file can be printed. The light-emitting module 300 includes a plurality of light-emitting chips 310. Each light-emitting chip 310 includes a plurality of light-emitting elements 311, the light-emitting elements 311 being light-emitting thyristors. The light-emitting chips 310 are elongated. The light-emitting elements 311 are arranged in a string along a long axis of the corresponding light-emitting chip 310. The light-emitting module 300 is also elongated. The light-emitting chips 310 are alternately arranged at both sides of a long axis of the light-emitting module 300. The lens array 200 includes a plurality of lens units 210 arranged in two rows corresponding to the light-emitting elements 311, so as to correspondingly receive light output by the light-emitting elements 311 (as illustrated by arrows in the figure). Whereby, the light can be calibrated and output to the photosensitive drum 100 (as illustrated by arrows in the figure). Here, although the light-emitting chips 310 are arranged on both sides of the long axis of the light-emitting module 300 separately, an exposure to the photosensitive drums 100 is in a straight line macroscopically. In other words, not only the light-emitting elements 311 on the respective light-emitting chips 310 are arranged in a string at a density of printing resolution. Macroscopically, the light-emitting elements 311 of the light-emitting chips 310 are also arranged in a string at a density corresponding to the printing resolution. That is, the density between the light-emitting elements 311 (in the long-axis direction of the light-emitting chip 310) is the number of light-emitting elements 311 within unit length, usually in units of dots per inch (dpi). Here, the printing resolution of 600 dpi is taken as the example.

Figure 2:
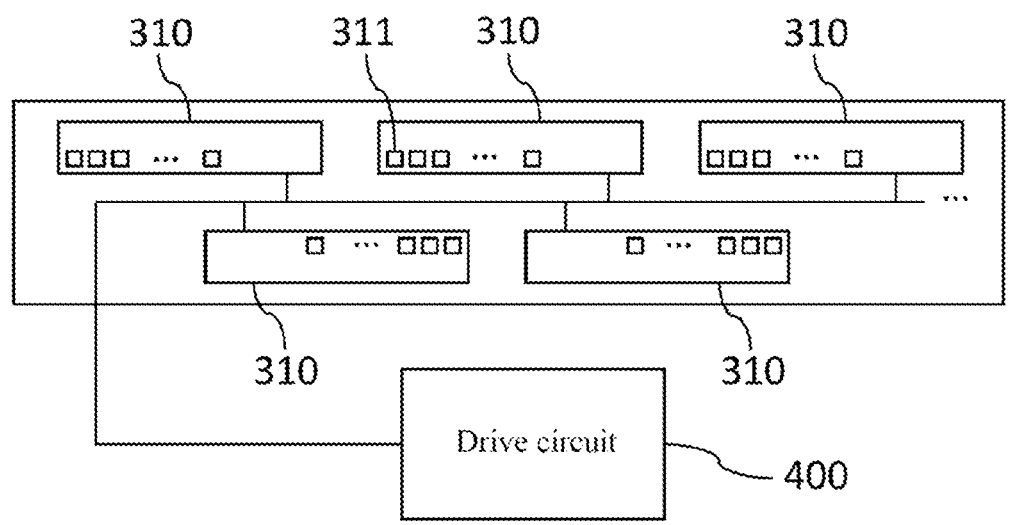
FIG. 2 is a schematic block diagram of a printing head according to an embodiment of the present invention.

Referring to FIG. 2, it is a schematic block diagram of a printing head according to an embodiment of the present invention. The printing head further includes a drive circuit 400. The drive circuit 400 is connected to the light-emitting elements 311 of the respective light-emitting chips 310 in the light-emitting module 300, and the light-emitting elements 311 may be driven to sequentially illuminate. The action principle will be described below. The printing head may be disposed in a printing device such as a printer or a photocopier.

Figure 3:
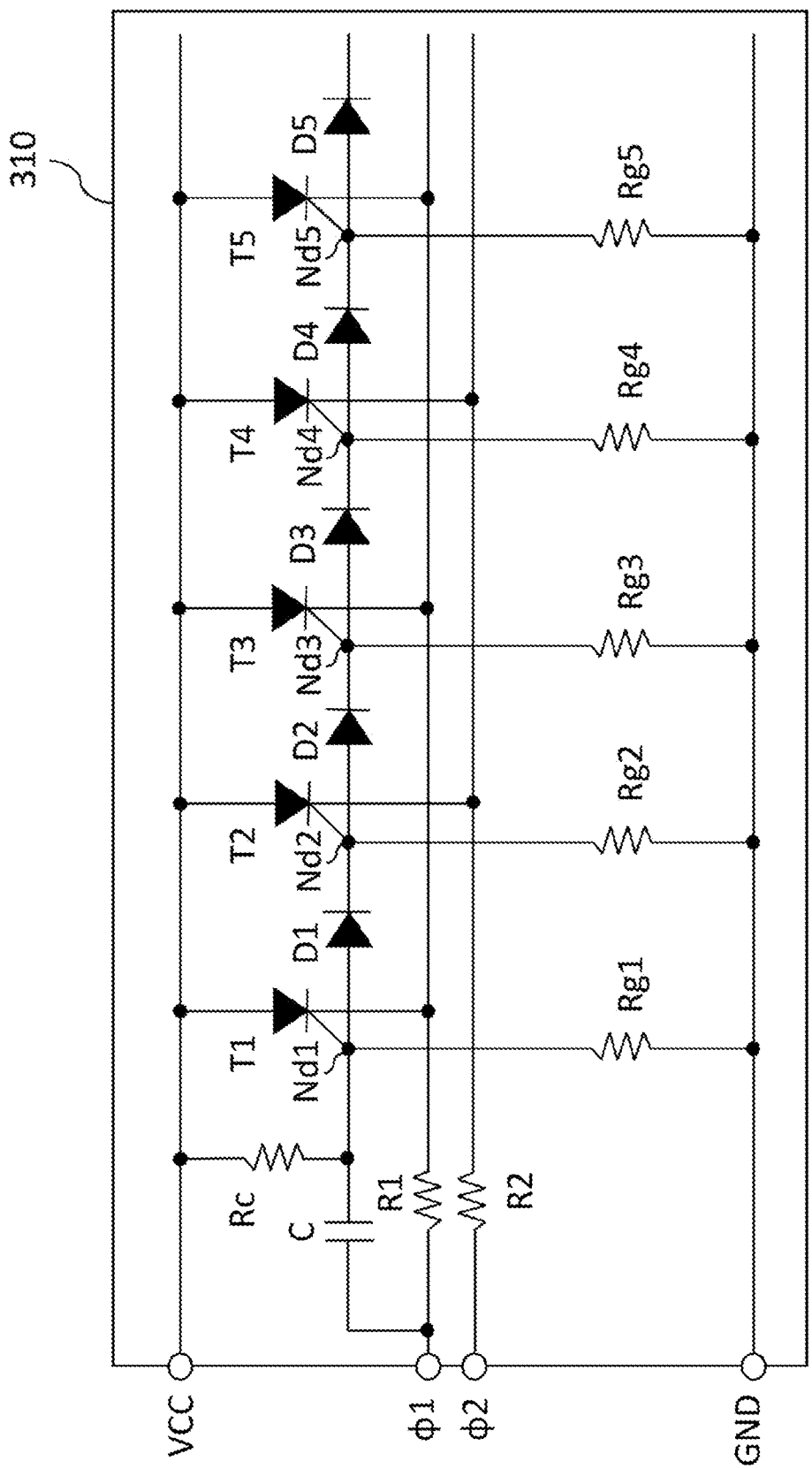
FIG. 3 is a schematic diagram of a shift circuit according to an embodiment of the present invention.
Figure 4:
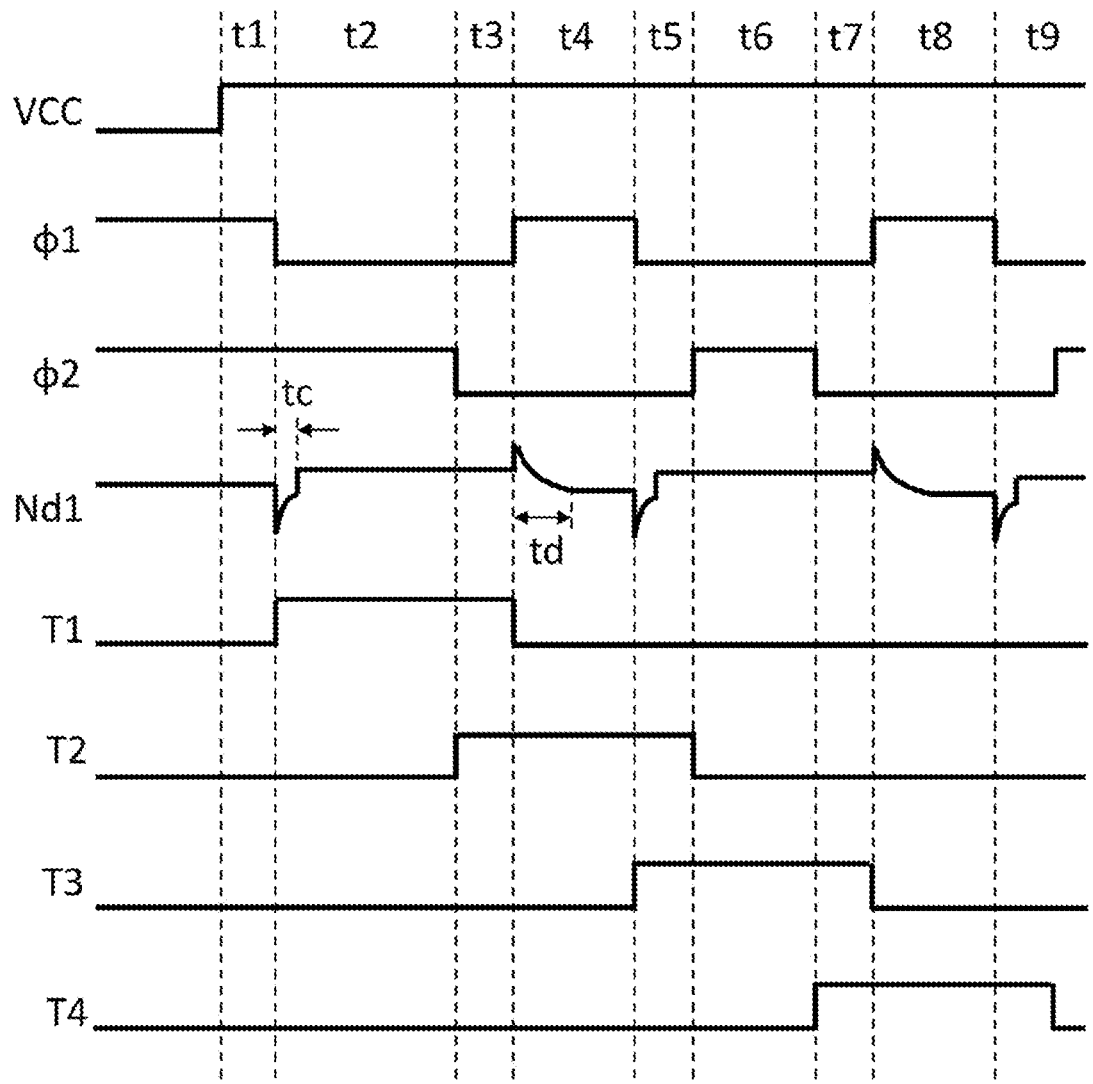
FIG. 4 is a schematic diagram of a signal according to an embodiment of the present invention.

Referring to FIG. 3, it is a schematic diagram of a shift circuit according to an embodiment of the present invention (a non-drawn portion is omitted due to the repeated nature). The light-emitting chip 310 is provided with a shift circuit operating by using a capacitor. In other words, here, the shift circuit is integrated on an integrated circuit. The shift circuit includes a power signal line VCC, a grounding signal line GND, a first shift signal line φ1, and a second shift signal line φ2, thereby connecting to the drive circuit 400 and being controlled by the drive circuit 400. Referring to FIG. 4, it is a schematic diagram of a signal according to an embodiment of the present invention. The power signal line VCC connects to the drive circuit 400 for receiving an operating voltage (e.g., 3.3 volts). The grounding signal line GND connects to the drive circuit 400 for obtaining a grounding level (not specifically drawn herein). The first shift signal line φ1 is configured to receive a first clock signal. A period of the first clock signal includes an on time (or called "high-level period") and an off time (or called "low-level period"). The second shift signal line φ2 is configured to receive a second clock signal. A period of the second clock signal also includes an on time and an off time. There is a delay time between the first clock signal and the second clock signal, such that both clock signals are low-level within one time interval (e.g., a time interval t3, t5, or t7); the first clock signal is high-level and the second clock signal is low-level within one time interval (e.g., a time interval t4 or t8); and the first clock signal is low-level and the second clock signal is high-level within one time interval (e.g., a time interval t2 or t6). Moreover, a duty ratio of the first clock signal to the second clock signal is less than 0.5, which means that the on time is less than the off time.

As shown in FIG. 3, the shift circuit further includes a plurality of diodes D1-Dn (n is a positive integer), a plurality of grounding resistors Rg1-Rgm (m is a positive integer), a plurality of thyristors T1-Tk (k is a positive integer), a cascaded resistor Rc, current-limiting resistors R1 and R2, and a capacitor C. The current-limiting resistors R1 and R2 respectively connect to the first shift signal line φ1 and the second shift signal line φ2 in series, so as to prevent from harming other elements caused by an over-large current thereon. The diodes D1-Dn are cascaded end to end, that is, a cathode of a previous diode Dn−1 connects to an anode of a subsequent diode Dn. The thyristor Tk includes a cathode, an anode and a gate. The anode connects to the power signal line VCC. The gate connects to the grounding signal line GND via the grounding resistor Rgm in a one-to-one correspondence manner. For example, the gate of the thyristor T1 connects to one end of the grounding resistor Rg1, and the other end of the grounding resistor Rg1 connects to the grounding signal line GND, and so on. The gates of the thyristors T1-Tk also respectively connect to one end of the respective diodes D1-Dn, such that the respective diodes D1-Dn connect between the gates of the two adjacent thyristors T1-Tk. For example, the diode D1 connects between the gates of the thyristors T1 and T2. The cathodes of the odd-ranked thyristors (e.g., T1, T3 and T5) connect to the first shift signal line φ1, and the cathodes of the even-ranked thyristors (e.g., T2, T4 and T6) connect to the second shift signal line φ2.

The cascaded resistor Rc connects between the gate of the first thyristor T1 and the power signal line VCC to be cascaded to the grounding resistor Rg1, thereby forming a voltage dividing circuit. The capacitor C connects between the gate of the first thyristor T1 and the first shift signal line φ1. Therefore, the capacitor C is charged during the off time of the period of the first clock signal (charge time tc), and starts to be discharged from an edge between the on time and the off time of the period of the first clock signal. During the on time of the period, the capacitor is fully discharged (discharge time td). Detailed description will be made later.

Figure 5:
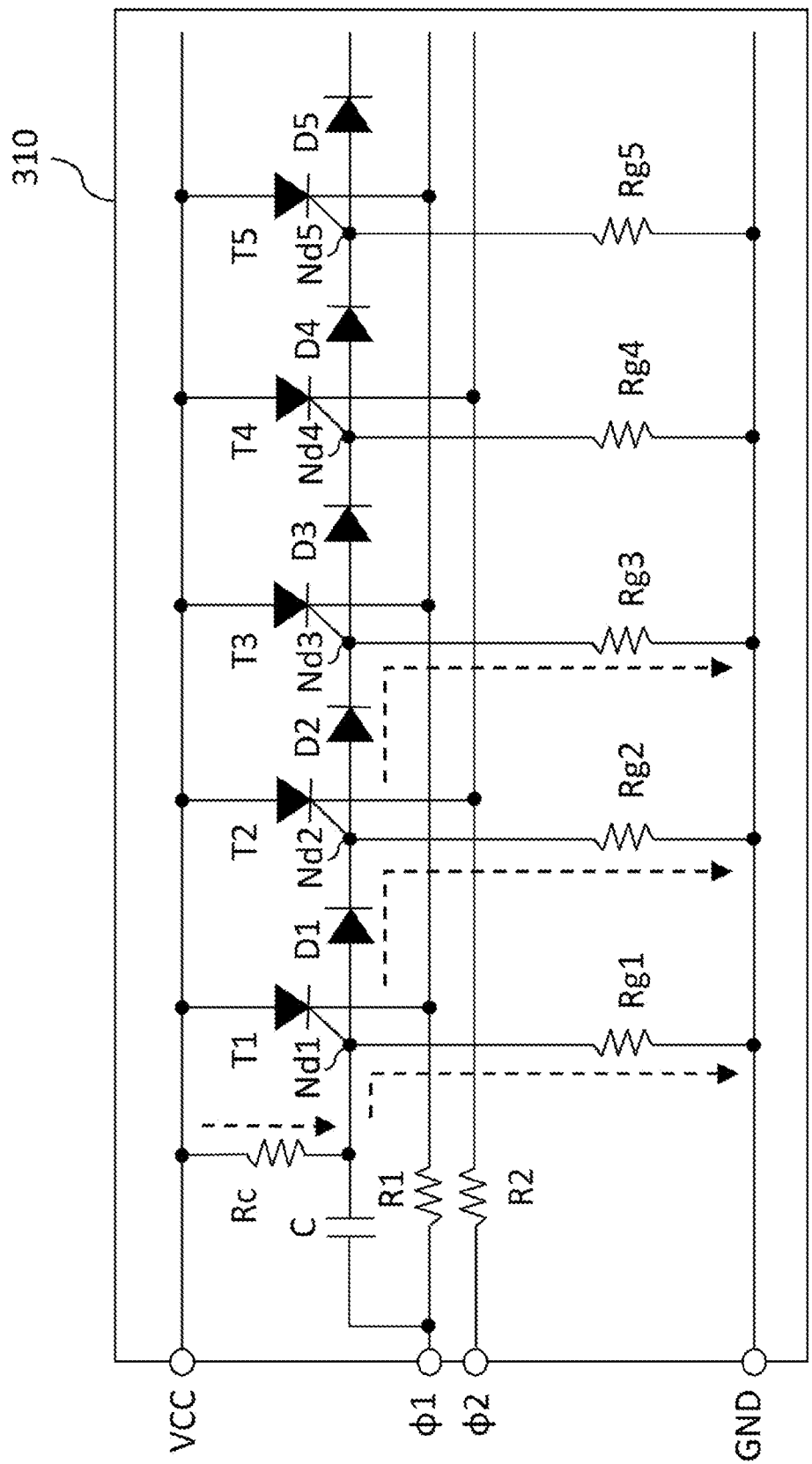
FIG. 5 is a schematic state diagram of a time interval t1 in FIG. 4.

Referring to FIG. 4 and FIG. 5 together, FIG. 5 is a schematic state diagram of a time interval t1 in FIG. 4. In an initial state, the first clock signal transmitted by the first shift signal line φp1 is in a high-level state, and the second clock signal transmitted by the second shift signal line φ2 is also in a high-level state. Therefore, the cathodes of the respective thyristors Tk are all at a high level, e.g., 3.3 volts. Since the cascaded resistor Rc and the grounding resistor Rg1 form the voltage dividing circuit, a voltage of a node Nd1 (i.e., the gate of the first thyristor T1) therebetween is the voltage dividing level thereof. Here, the voltage of the node Nd1 is 2.8 volts by a resistance ratio of the cascaded resistor Rc to the grounding resistor Rg1. Since the cascaded resistor Rc of the present embodiment is integrated on the integrated circuit, if a lower resistance value is made, a relatively large area is required, and thus the resistance value of the cascaded resistor Rc is generally in a range of 5 k to 25 k ohms. A ratio of resistances of the cascaded resistor Rc to the first grounding resistor Rg1 is in a range from 1/10 to 2/5, e.g., 1/4. A barrier voltage of the diodes D1-Dn may in a range between 1.0 volt and 2.0 volts. For example, the barrier voltage of the diodes D1-Dn is 1.2 volts here. Therefore, the diodes D1 and D2 are turned on, the voltage of a node Nd2 is 1.6 volts, the voltage of a node Nd3 is 0.4 volt, and the voltage of the remaining nodes Ndx is 0 volt (x is a positive integer). Therefore, a forward bias voltage cannot be obtained between the gates and the cathodes of the respective thyristors Tk, and thus the respective thyristors Tk are all turned off.

Figure 6:
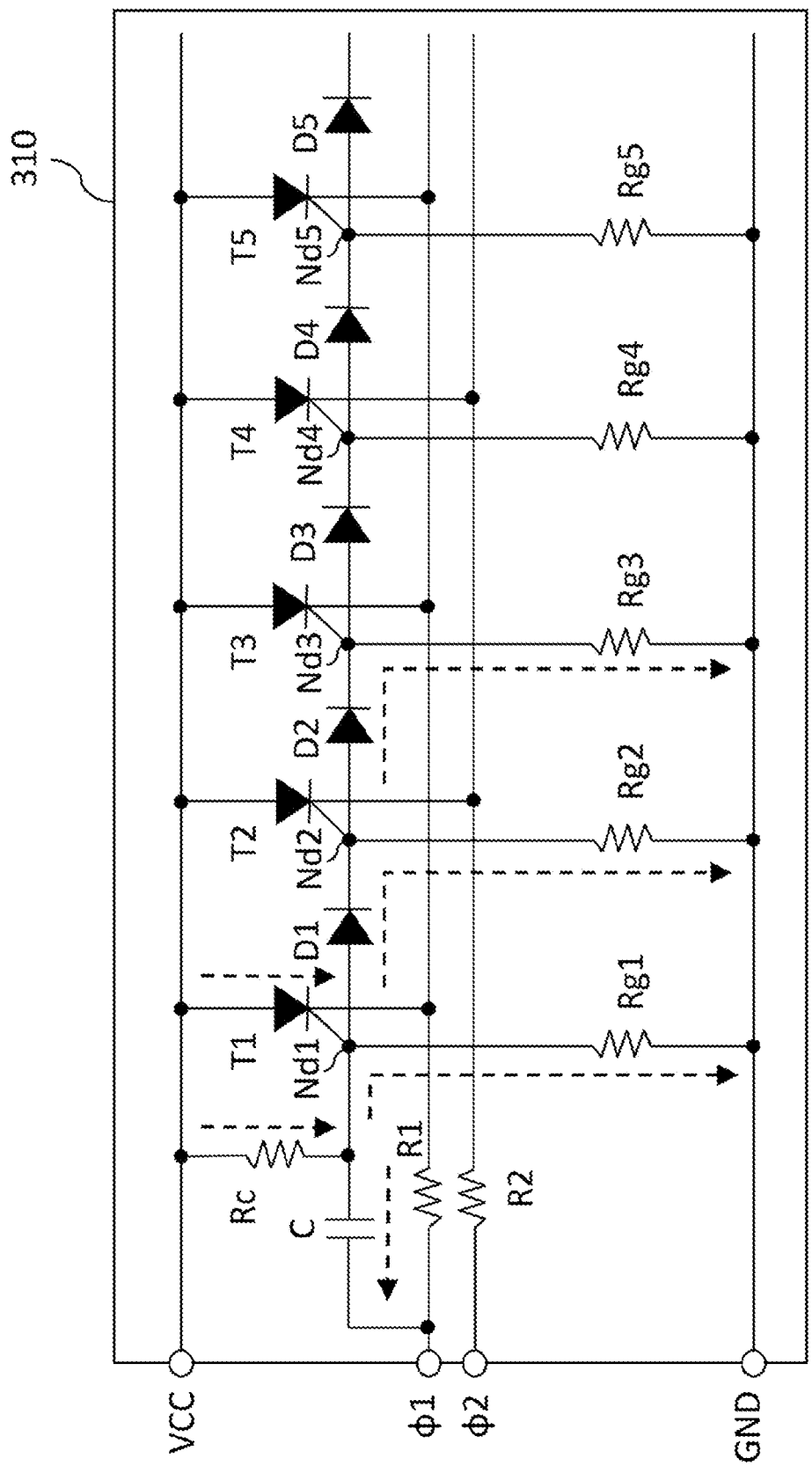
FIG. 6 is a schematic state diagram of a time interval t2 in FIG. 4.

Referring to FIG. 4 and FIG. 6 together, FIG. 6 is a schematic state diagram of a time interval t2 in FIG. 4. In the time interval t2, the first clock signal transmitted by the first shift signal line φ1 is changed to be in a low-level state, and the second clock signal transmitted by the second shift signal line φ2 is still in a high-level state. Since the first clock signal is in a low-level state (i.e., 0 volt) and no power is stored in the capacitor C, the node Nd1 instantaneously drops to 0 volt. Then, current flowing through the cascaded resistor Rc continues to charge the capacitor C. When the capacitor C is continuously charged through the foregoing charge time tc, the voltage of the node Nd1 reaches an on voltage enabling the first thyristor T1 to be turned on, such that the voltage of the node Nd1 rises to an operating voltage (i.e., 3.3 volts) instantaneously due to the turn-on of the thyristor T1. Therefore, the voltage of the node Nd2 is changed from 1.6 volts to 2.1 volts, the voltage of the node Nd3 is changed from 0.4 volt to 0.9 volt, the voltage of the remaining nodes Ndx is 0 volt, and the diodes D1 and D2 remain in an on state. The thyristor Tk other than the first thyristor T1 remains off because a forward bias cannot be obtained.

Figure 7:
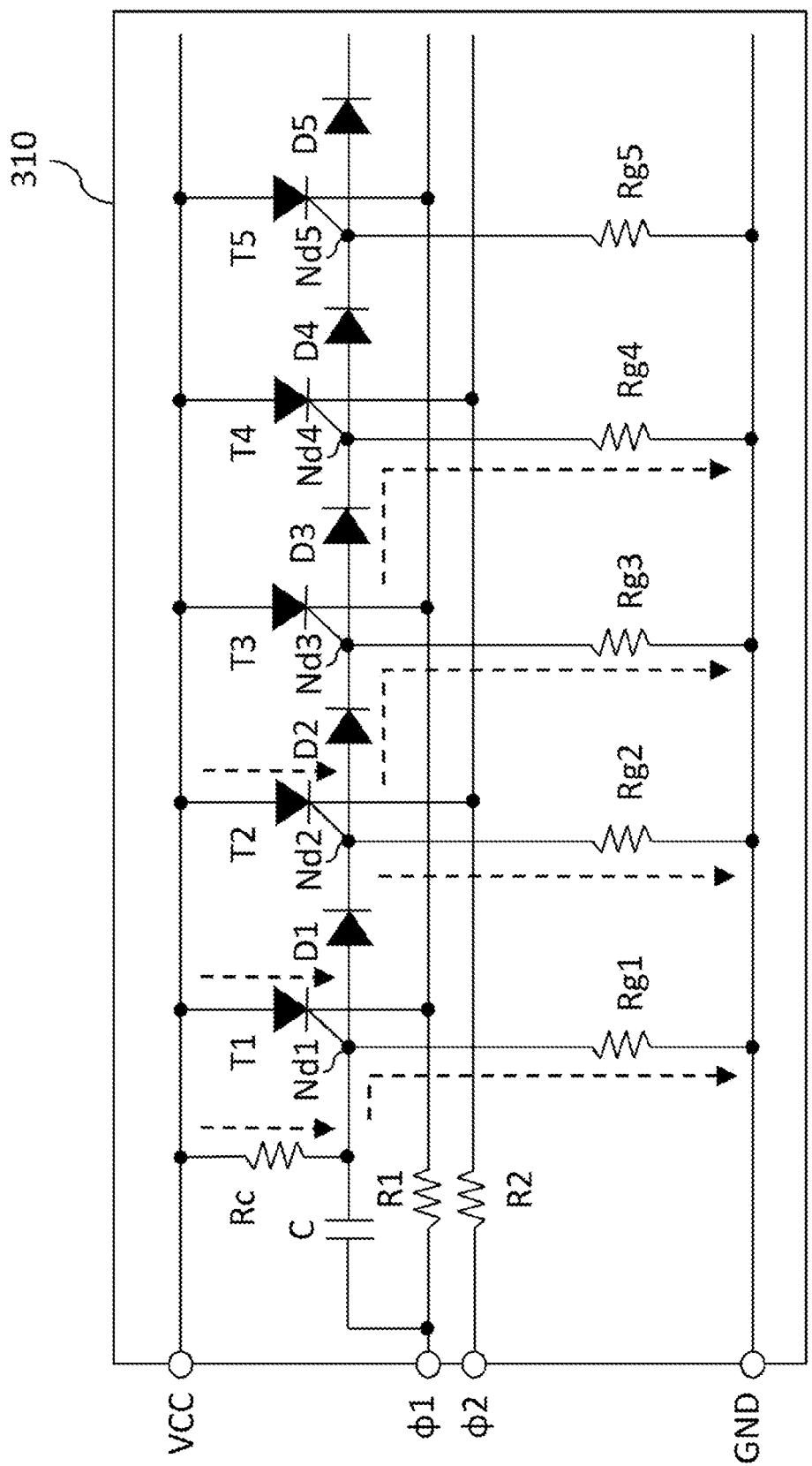
FIG. 7 is a schematic state diagram of a time interval t3 in FIG. 4.

Referring to FIG. 4 and FIG. 7 together, FIG. 7 is a schematic state diagram of a time interval t3 in FIG. 4. In the time interval t3, the first clock signal transmitted by the first shift signal line φ1 and the second clock signal transmitted by the second shift signal line φ2 are both in a low-level state. Therefore, the first thyristor T1 also retains in an on state, and the voltage of the node Nd1 is still 3.3 volts. As can be seen from the foregoing description of the time interval t2, the voltage of the node Nd2 is higher than the voltage of a node Nd4. Therefore, in the time interval t3, since the second clock signal is in a low-level state, a forward bias is obtained between the gate and cathode of the second thyristor T2. Therefore, the second thyristor T2 is turned on, such that the voltage of the node Nd2 is changed from 2.1 volts to an operating voltage (3.3 volts). The voltage of the node Nd3 is changed from 0.9 volt to 2.1 volts, the voltage of the node Nd4 is changed from 0 volt to 0.9 volt, and the voltage of the remaining nodes Ndx is 0 volt. The diode D1 receives a reverse bias and is turned off, the diodes D2 and D3 receive the forward bias and are turned on, and the remaining diodes Dn are turned off. The other thyristors Tk remain off because the forward bias cannot be obtained.

Figure 8:
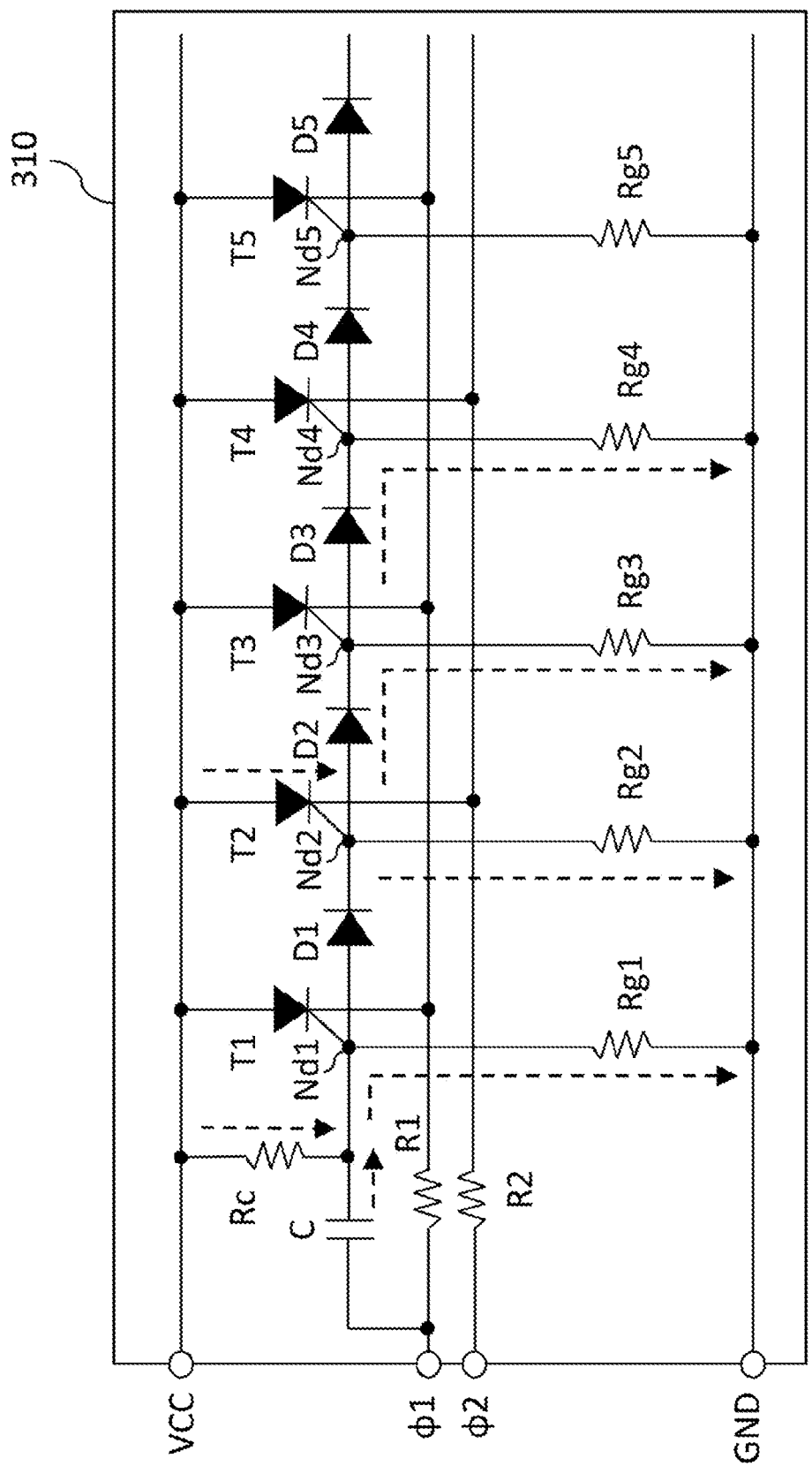
FIG. 8 is a schematic state diagram of a time interval t4 in FIG. 4.

Referring to FIG. 4 and FIG. 8 together, FIG. 8 is a schematic state diagram of a time interval t4 in FIG. 4. In the time interval t4, the first clock signal transmitted by the first shift signal line φ1 is changed to be in a high-level state, and the second clock signal transmitted by the second shift signal line φ2 remains in a low-level state. At this time, since the anode and cathode of the first thyristor T1 both receive 3.3 volts, the first thyristor T1 is turned off. Then, the first thyristor T1 is turned on within the time intervals t2 and t3. Since the first thyristor T1 is turned off, the cascaded resistor Rc and the grounding resistor Rg1 form a current path again, and form a discharge path of the capacitor C. Therefore, the node Nd1 instantaneously rises due to the voltage across the capacitor C (here, 4 volts), and gradually changes to a voltage dividing level of the voltage dividing circuit (here, 2.8 volts) along with the discharge of the capacitor C. On the other hand, the anode of the second thyristor T2 receives an operating voltage while the cathode remains in a low-level state. Therefore, the second thyristor T2 remains on, such that the voltage of the node Nd2 remains to be the operating voltage (here, 3.3 volts). The voltage state of the remaining nodes is the same as that in the time interval t3, the voltage of the node Nd3 is 2.1 volts, the voltage of the node Nd4 is 0.9 volt, and the voltage of the remaining nodes Ndx is 0 volt. The diode D1 receives a reverse bias and is turned off, the diodes D2 and D3 receive the forward bias and are turned on, and the remaining diodes Dn are turned off. The other thyristors Tk remain off because the forward bias cannot be obtained.

Figure 9:
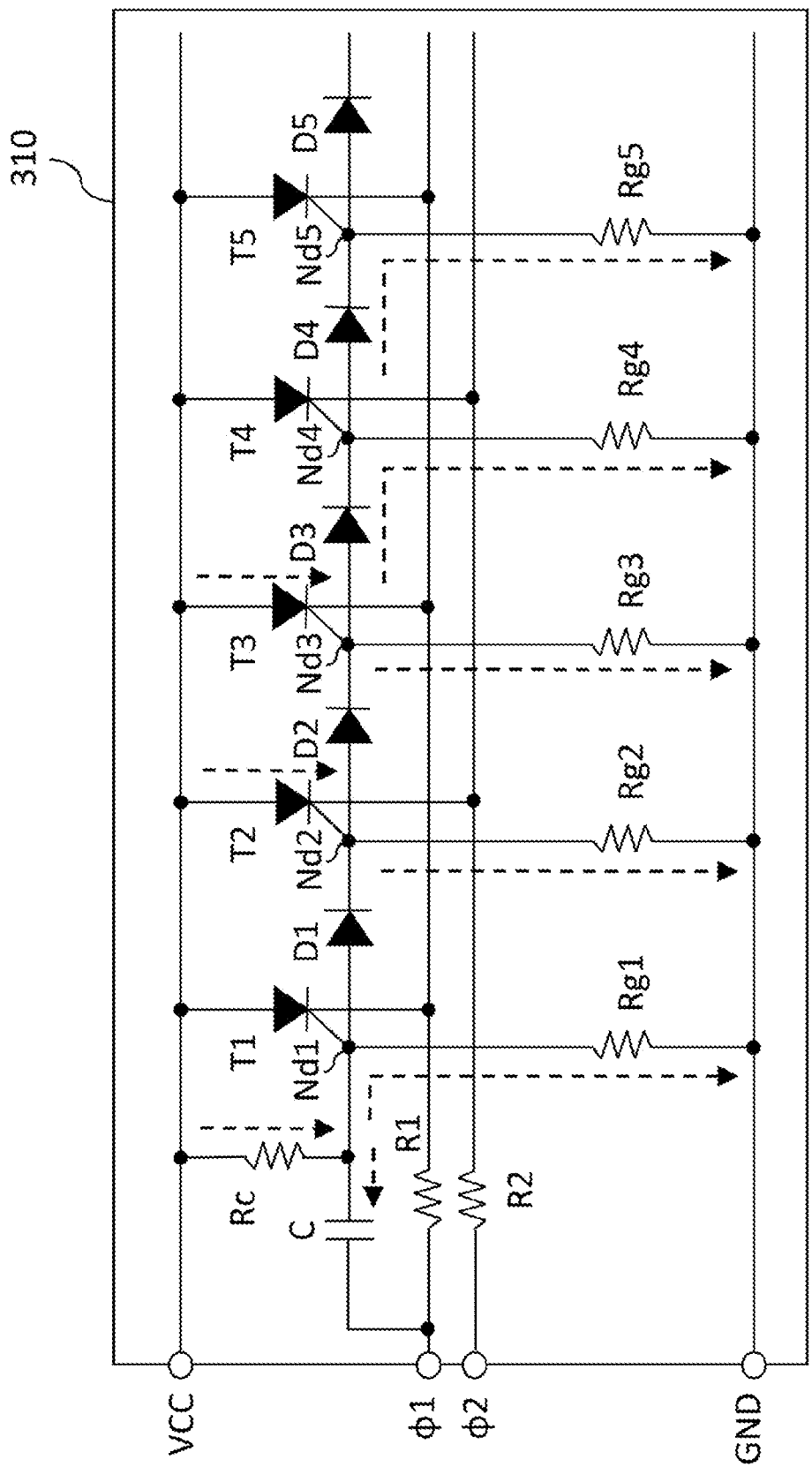
FIG. 9 is a schematic state diagram of a time interval t5 in FIG. 4.

Referring to FIG. 4 and FIG. 9 together, FIG. 9 is a schematic state diagram of a time interval t5 in FIG. 4. In the time interval t5, the first clock signal transmitted by the first shift signal line φ1 and the second clock signal transmitted by the second shift signal line φ2 are both returned to be in a low-level state. In the time interval t4, although the voltage of the node Nd1 is higher than the voltage of the node Nd3, when the time interval t5 is entered, the second clock signal is, however, changed to be in a low-level state, and the capacitor C is fully discharged without voltage across, such that the voltage of the node Nd1 is instantaneously changed to 0 volt. Therefore, the voltage of the node Nd3 is higher than the voltages of the nodes Nd1 and Nd5, so that the third thyristor T3 is preferentially turned on to achieve the effect of shift. In other words, according to the present invention, the capacitor C is fully discharged during the on time of the period of the first clock signal, such that during the off time of the period of the first clock signal, the gate voltage of the first thyristor T1 is lower than the gate voltage of a thyristor (here, the third thyristor T3) to be shifted and turned on, and a next thyristor can be smoothly shifted and turned on. On the other hand, the anode of the second thyristor T2 receives an operating voltage while the cathode remains in a low-level state. Therefore, the second thyristor T2 remains on, such that the voltage of the node Nd2 remains to be the operating voltage (here, 3.3 volts). Here, the voltage of the node Nd3 is also an operating voltage (3.3 volts) due to the turn-on of the third thyristor T3, the voltage of the node Nd4 is 2.1 volts, the voltage of the node Nd5 is 0.9 volt, and the voltage of the remaining nodes Ndx is 0 volt. Then, the diodes D1 and D2 are turned off, the diodes D3 and D4 are turned on, and the remaining diodes Dn remain off. The other thyristors Tk remain off because the forward bias cannot be obtained.

Figure 10:
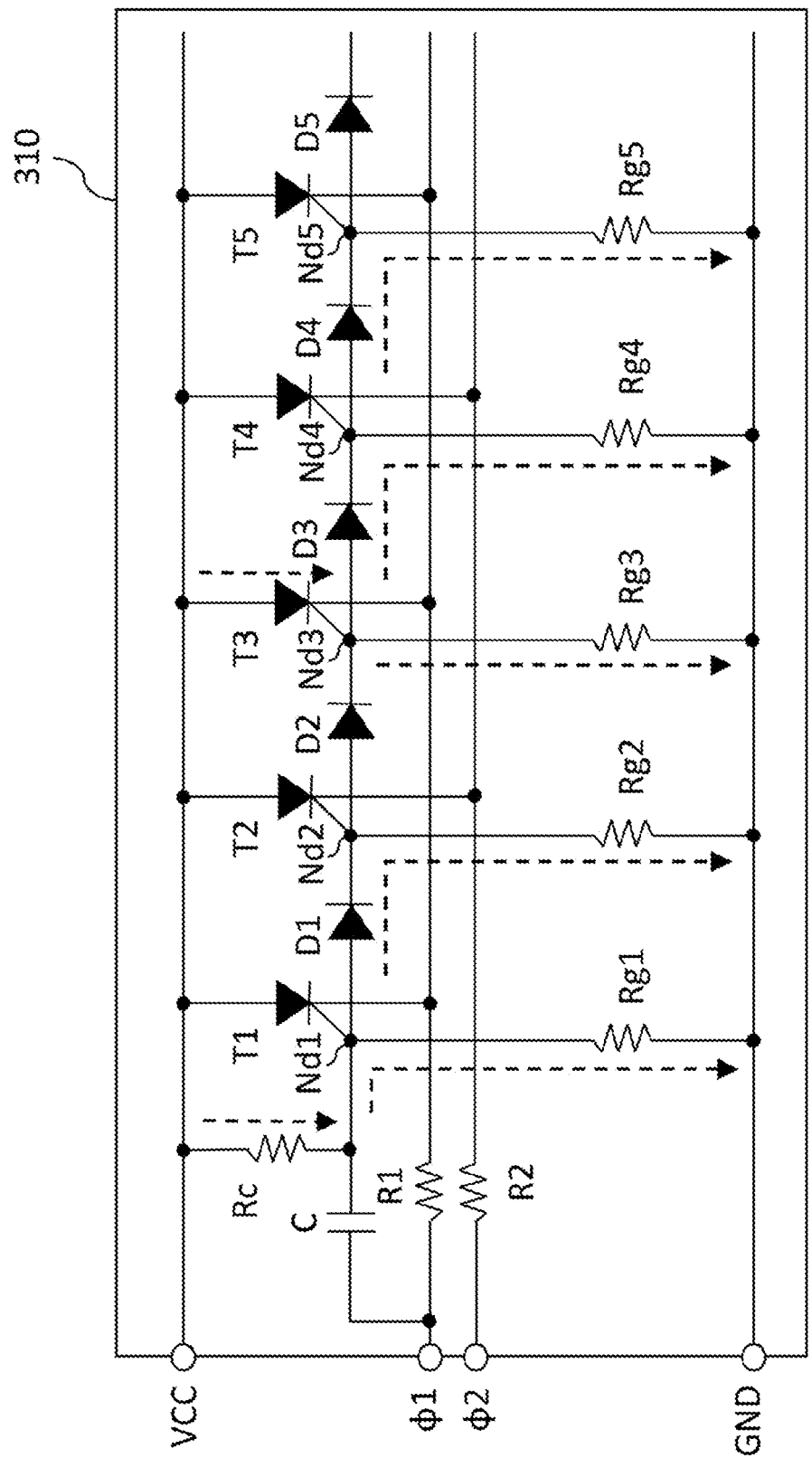
FIG. 10 is a schematic state diagram of a time interval t6 in FIG. 4.

Referring to FIG. 4 and FIG. 10 together, FIG. 10 is a schematic state diagram of a time interval t6 in FIG. 4. In the time interval t6, the first clock signal transmitted by the first shift signal line φ1 remains in a low-level state, and the second clock signal transmitted by the second shift signal line φ2 is changed to be in a high-level state. At this time, since the anode and cathode of the second thyristor T2 are both in a high-level state, the second thyristor T2 is turned off. The third thyristor T3 remains in an on state. It is worth noting that the node Nd1 is a voltage dividing level (here, 2.8 volts) of the voltage dividing circuit formed by the cascaded resistor Rc and the grounding resistor Rg1, the diode D1 is turned on, and the voltage of the node Nd2 is 1.6 volts after voltage across the diode D1. The voltage of the node Nd3 is an operating voltage (here, 3.3 volts) due to the turn-on of the third thyristor T3, and therefore the diode D2 is turned off. The voltages of the nodes Nd4 and Nd5 are 2.1 volts and 0.9 volt respectively. Therefore, the voltage of the node Nd4 is higher than the voltages of the nodes Nd2 and Nd6, so when the second clock signal is changed to be in a low-level state after entering a next time interval (i.e., a time interval t7), the fourth thyristor T4 will be preferentially turned on and the turned on states of the thyristors can be shifted (as shown in FIG. 11).

Figure 11:
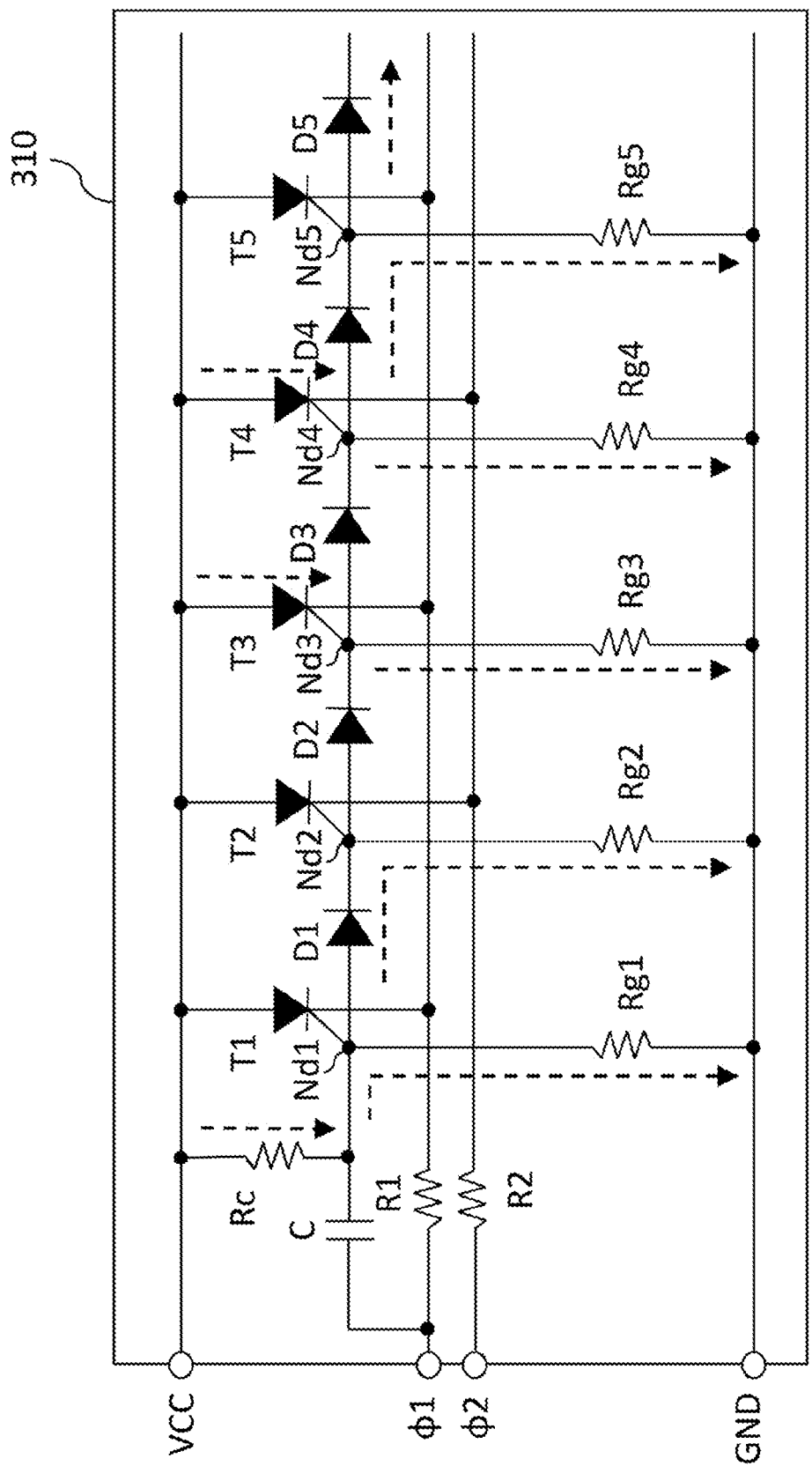
FIG. 11 is a schematic state diagram of a time interval t7 in FIG. 4.

Referring to FIG. 4 and FIG. 11 together, FIG. 11 is a schematic state diagram of a time interval t7 in FIG. 4. In the time interval t7, the first clock signal transmitted by the first shift signal line φ1 and the second clock signal transmitted by the second shift signal line φ2 both remain in a low-level state. As described above, the fourth thyristor T4 is preferentially turned on, and the third thyristor T3 also remains in an on state. Therefore, the voltages of the nodes Nd3 and Nd4 are operating voltages (3.3 volts). The voltages of the nodes Nd1 and Nd2 are 2.8 volts and 1.6 volts as described above, respectively. The voltages of the nodes Nd5 and Nd6 are also 2.1 volts and 0.9 volt due to voltage across the diodes D4 and D5, respectively. Therefore, the diodes D1, D4 and D5 are turned on, and the remaining diodes Dn are turned off.

Figure 12:
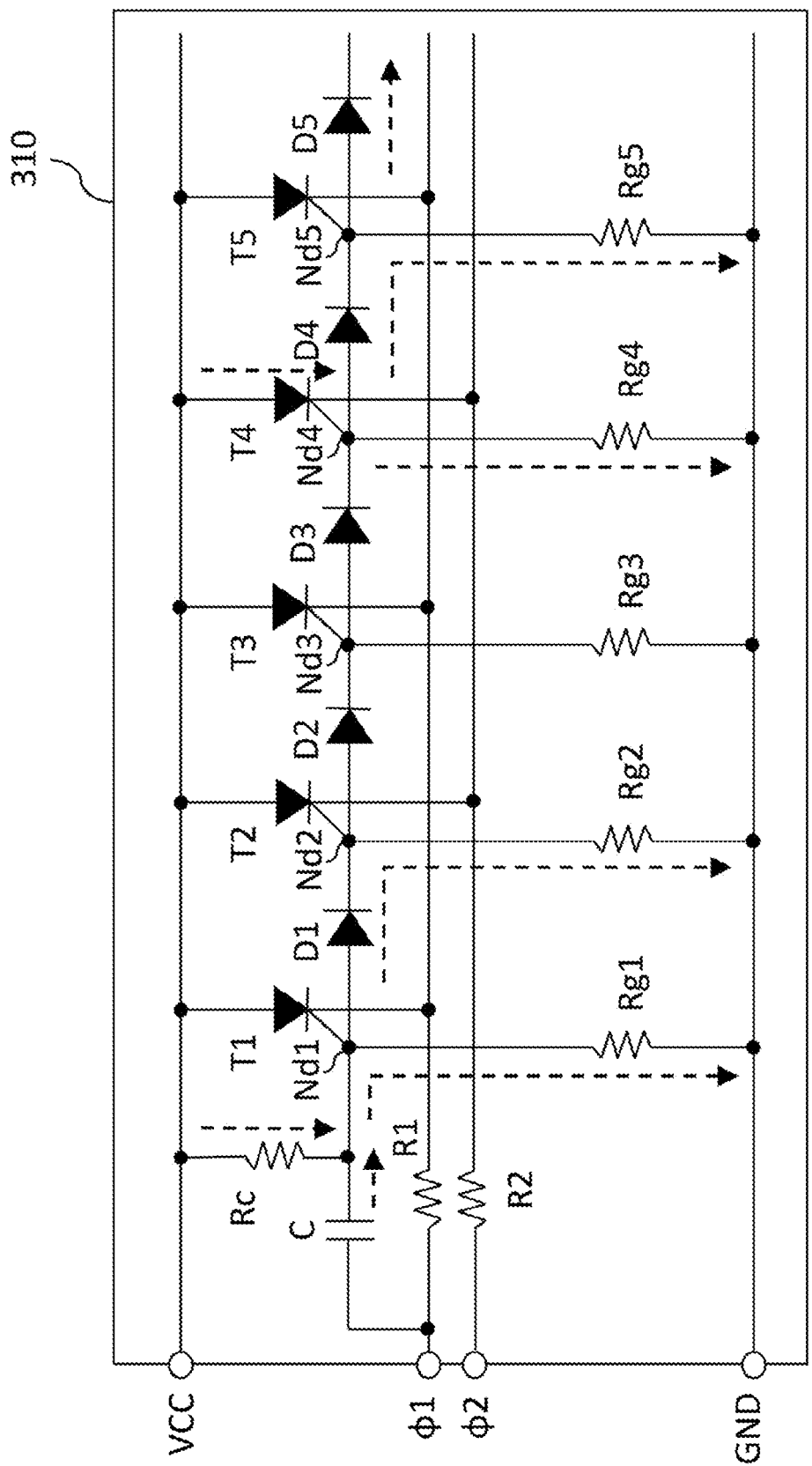
FIG. 12 is a schematic state diagram of a time interval t8 in FIG. 4.

Referring to FIG. 4 and FIG. 12 together, FIG. 12 is a schematic state diagram of a time interval t8 in FIG. 4. In the time interval t8, the first clock signal transmitted by the first shift signal line φ1 is changed to be in a high-level state, and the second clock signal transmitted by the second shift signal line φ2 remains in a low-level state. Therefore, the anode and cathode of the third thyristor T3 are both in a high-level state, such that the third thyristor T3 is turned off. The fourth thyristor T4 continues to be turned on. In a next time interval (i.e., a time interval t9), the fifth thyristor T5 is to be turned on. As described in the time interval t2, since the capacitor C has been fully discharged in the time interval t8, the voltage of the node Nd1 entering the time interval t9 instantaneously drops to a low-level state. Therefore, the voltages of the nodes Nd1 and Nd3 are lower than the voltage of the node Nd5, so the fifth thyristor T5 can be smoothly turned on to complete the shift.

Figure 13:
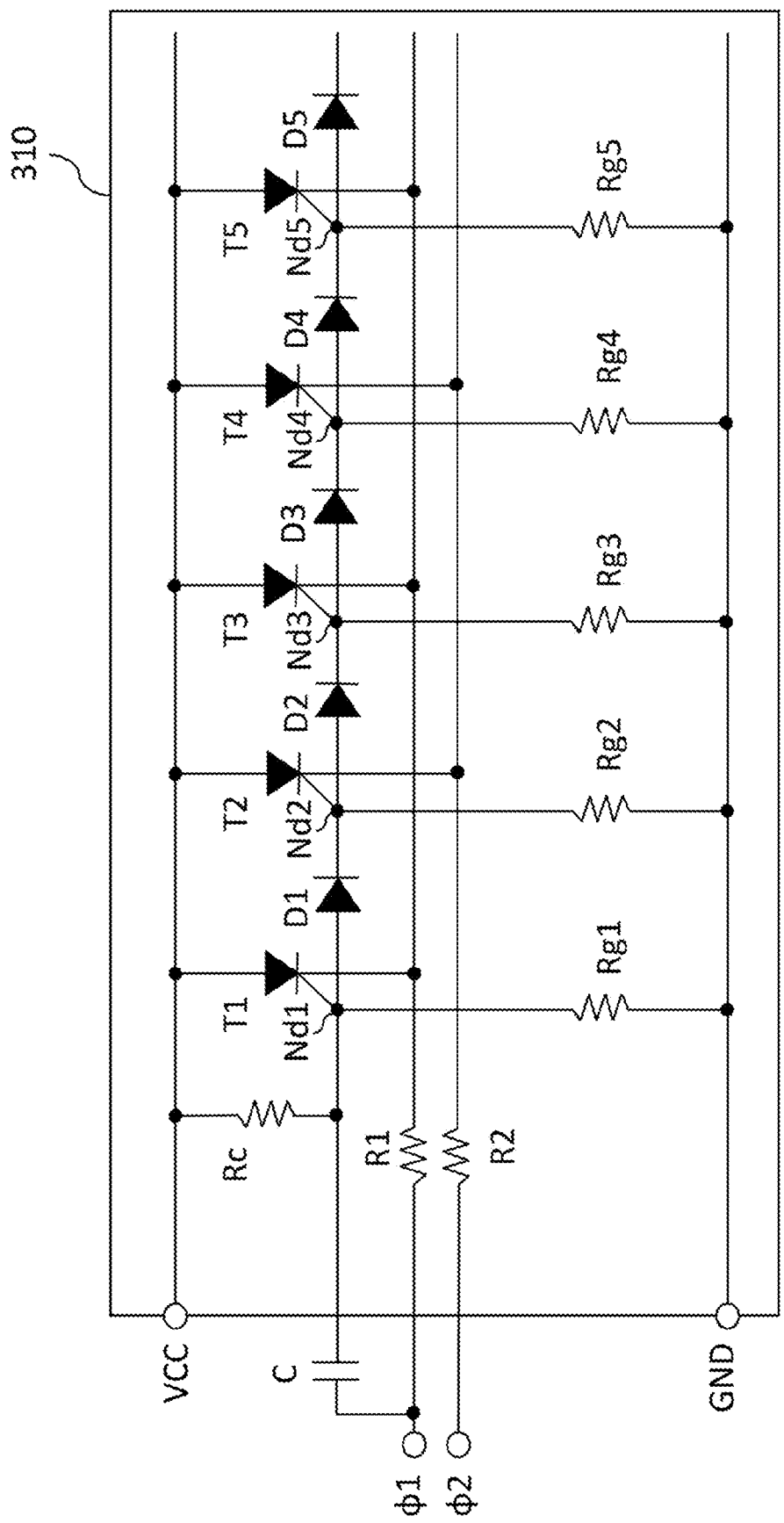
FIG. 13 is a schematic diagram of a shift circuit according to another embodiment of the present invention.

Referring to FIG. 13, it is a schematic diagram of a shift circuit according to another embodiment of the present invention. Compared with the foregoing embodiment, the diode Dn, the grounding resistor Rgm, the thyristor Tk and the cascaded resistor Rc of the present embodiment are integrated on an integrated circuit (i.e., light-emitting chip 310), and the capacitor C is not located on the integrated circuit.

Figure 14:
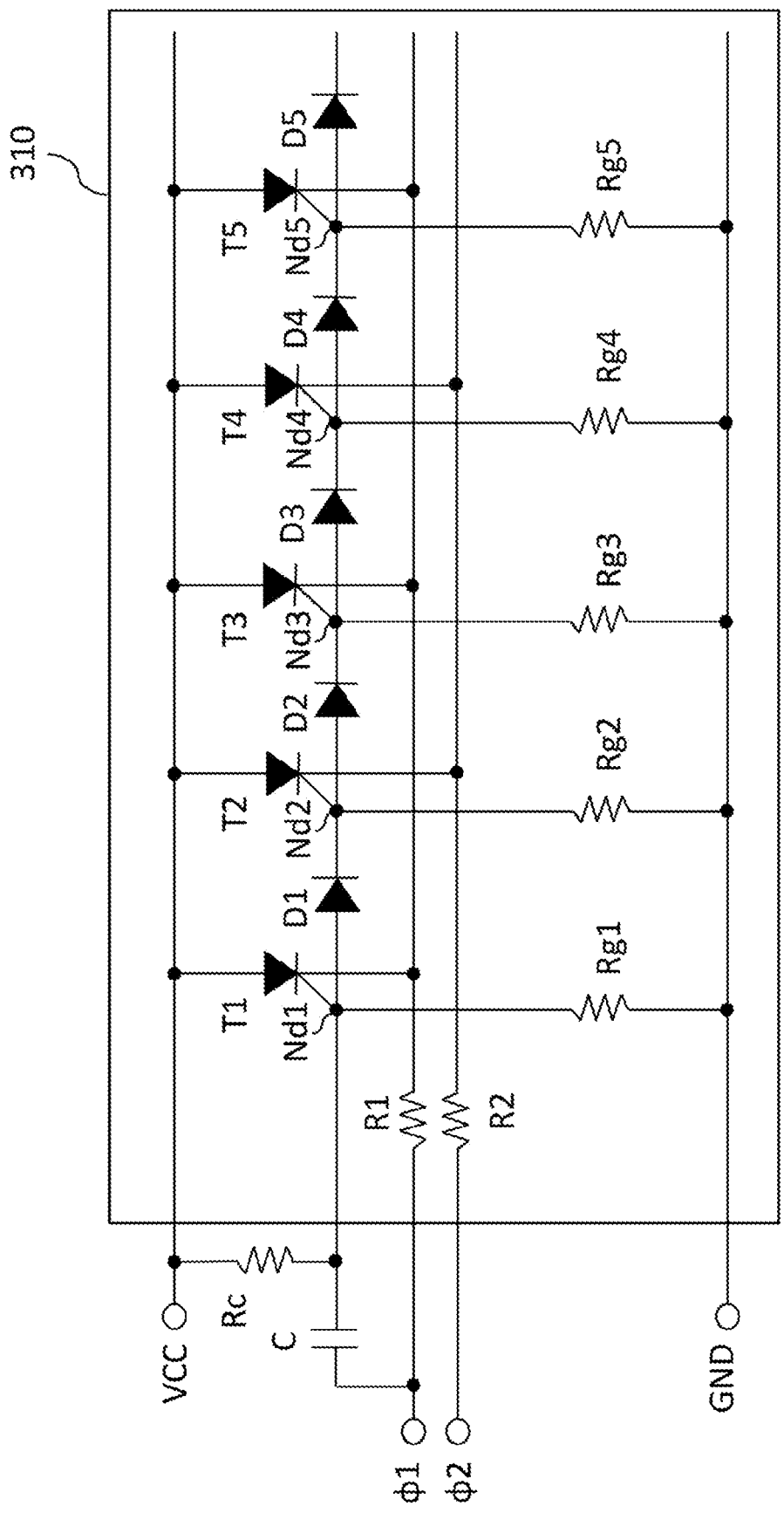
FIG. 14 is a schematic diagram of a shift circuit according to yet another embodiment of the present invention.

Referring to FIG. 14, it is a schematic diagram of a shift circuit according to yet another embodiment of the present invention. Compared with the foregoing embodiment, the diode Dn, the grounding resistor Rgm and the thyristor Tk of the present embodiment are integrated on an integrated circuit (i.e., light-emitting chip 310), and the capacitor C and the cascaded resistor Rc are not located on the integrated circuit.

It should be understood from the above description how the shift circuit of the present invention completes the shift action. The foregoing thyristor Tk is the foregoing light-emitting element 311, that is, the thyristor Tk is a light-emitting thyristor. According to the embodiments of the present invention, by means of the ingenious arrangement of the capacitor C and the voltage dividing circuit, the gate voltage of the first thyristor T1 is sufficient to turn on the first thyristor T1 and will not affect the following shift action because of the capacitor C after shift, and there is no need to additionally connect a start signal line to the gate of the first thyristor T1 to provide a control signal, which can reduce the complexity of a connection line outside the light-emitting chip 310 and can reduce the cost.

What is claimed is:

1. A shift circuit operating by using a capacitor, comprising:
   a power signal line, configured to receive an operating voltage;
   a grounding signal line, configured to obtain a grounding level;
   a first shift signal line, configured to receive a first clock signal, a period of the first clock signal comprising an on time and an off time;
   a second shift signal line, configured to receive a second clock signal;
   a plurality of diodes, cascaded end to end;
   a plurality of grounding resistors;
   a plurality of thyristors, the respective thyristors comprising a cathode, an anode and a gate, the respective anodes connecting to the power signal line, the respective gates connecting to the grounding signal line via the grounding resistors in a one-to-one correspondence manner, and the respective gates connecting to one end of the respective diodes, such that the respective diodes connect between the gates of two adjacent thyristors, wherein the cathodes of the odd-ranked thyristors connect to the first shift signal line, and the cathodes of the even-ranked thyristors connect to the second shift signal line;
   a cascaded resistor, connecting between the gate of the first thyristor and the power signal line; and
   a capacitor, connecting between the gate of the first thyristor and the first shift signal line, so that the capacitor is charged during the off time of the period of the first clock signal, and starts to be discharged from an edge between the on time and the off time of the period of the first clock signal, and during the on time of the period, the capacitor is fully discharged.

2. The shift circuit operating by using a capacitor according to claim 1, wherein a ratio of resistances of the cascaded resistor to the first grounding resistor is in a range from 1/10 to 2/5.

3. The shift circuit operating by using a capacitor according to claim 1, wherein a barrier voltage of the diode is in a range between 1.0 volt and 2.0 volts.

4. The shift circuit operating by using a capacitor according to claim 1, wherein the shift circuit is integrated on an integrated circuit.

5. The shift circuit operating by using a capacitor according to claim 1, wherein the diodes, the grounding resistors and the thyristors are integrated on an integrated circuit.

6. The shift circuit operating by using a capacitor according to claim 1, wherein the diodes, the grounding resistors, the thyristors and the cascaded resistor are integrated on an integrated circuit, the capacitor being not located on the integrated circuit.

7. A printing head, comprising the shift circuit according to claim 1, wherein the thyristors are light-emitting thyristors.

8. The printing head according to claim 7, wherein a ratio of resistances of the cascaded resistor to the first grounding resistor is in a range from 1/10 to 2/5.

9. The printing head according to claim 7, wherein a barrier voltage of the diode is in a range between 1.0 volt and 2.0 volts.

10. The printing head according to claim 7, wherein the shift circuit is integrated on an integrated circuit.

11. The printing head according to claim 7, wherein the diodes, the grounding resistors and the thyristors are integrated on an integrated circuit.

12. The printing head according to claim 7, wherein the diodes, the grounding resistors, the thyristors and the cascaded resistor are integrated on an integrated circuit, the capacitor being not located on the integrated circuit.

13. A printer, comprising a printing head, the printing head comprising the shift circuit according to claim 1, wherein the thyristors are light-emitting thyristors.

14. The printer according to claim 13, wherein a ratio of resistances of the cascaded resistor to the first grounding resistor is in a range from 1/10 to 2/5.

15. The printer according to claim 13, wherein a barrier voltage of the diode is in a range between 1.0 volt and 2.0 volts.

16. The printer according to claim 13, wherein the shift circuit is integrated on an integrated circuit.

17. The printer according to claim 13, wherein the diodes, the grounding resistors and the thyristors are integrated on an integrated circuit.

18. The printer according to claim 13, wherein the diodes, the grounding resistors, the thyristors and the cascaded resistor are integrated on an integrated circuit, the capacitor being not located on the integrated circuit.

* * * * *